United States Patent
Elsdoerfer et al.

(10) Patent No.: US 11,231,455 B2
(45) Date of Patent: Jan. 25, 2022

(54) SYSTEM AND METHOD FOR CONTROLLING TEMPERATURE AT TEST SITES

(71) Applicant: Temptronic Corporation, Mansfield, MA (US)

(72) Inventors: Norbert Elsdoerfer, Warwick, RI (US); Chuan Weng, Cummings, GA (US)

(73) Assignee: TEMPTRONIC CORPORATION, Mansfield, MA (US)

( * ) Notice: Subject to any disclaimer, the term of this patent is extended or adjusted under 35 U.S.C. 154(b) by 0 days.

(21) Appl. No.: 16/692,334

(22) Filed: Nov. 22, 2019

(65) Prior Publication Data

US 2020/0174065 A1 Jun. 4, 2020

Related U.S. Application Data

(60) Provisional application No. 62/775,169, filed on Dec. 4, 2018.

(51) Int. Cl.
*G01R 31/28* (2006.01)

(52) U.S. Cl.
CPC ..... *G01R 31/2877* (2013.01); *G01R 31/2875* (2013.01)

(58) Field of Classification Search
CPC ............ G01R 31/2877; G01R 31/2875; G01R 31/2874; G05D 23/1934; G05D 23/1919
See application file for complete search history.

(56) References Cited

U.S. PATENT DOCUMENTS

| | | | |
|---|---|---|---|
| 4,084,635 A * | 4/1978 | Marshall | F28D 9/0037 165/104.31 |
| 4,734,872 A | 3/1988 | Eager et al. | |
| 6,185,952 B1 * | 2/2001 | McCollin | F24F 3/1423 62/259.2 |
| 9,920,963 B1 * | 3/2018 | Rafalovich | F24F 3/1405 |
| 2005/0227503 A1 * | 10/2005 | Reitinger | H01L 21/67109 438/795 |
| 2006/0290370 A1 * | 12/2006 | Lopez | G01R 31/2874 324/750.09 |
| 2013/0345893 A1 * | 12/2013 | David | G05D 23/00 700/300 |
| 2017/0268792 A1 * | 9/2017 | Costakis | F24F 5/0007 |

OTHER PUBLICATIONS

ISR and Written Opinion in corresponding application No. PCT/US2019/063500, dated Feb. 17, 2020.

* cited by examiner

*Primary Examiner* — Dominic E Hawkins
(74) *Attorney, Agent, or Firm* — Burns & Levinson LLP; Steven M. Mills

(57) ABSTRACT

A temperature control system includes a fluid chiller, an air dryer, and a plurality of test stations positioned at remote locations from the fluid chiller and the air dryer. The fluid chiller is configured to generate a chilled fluid stream. The air dryer is configured to generate a dry air stream. Each local test station includes a heat exchanger and thermal control unit. The heat exchanger is configured to selectively cool the dry air stream with the chilled fluid stream to generate an output stream. The thermal control unit is configured to control distribution of the output stream to a local test site.

12 Claims, 4 Drawing Sheets

SYSTEM AND METHOD FOR CONTROLLING TEMPERATURE AT TEST SITES

CROSS REFERENCE TO RELATED APPLICATIONS

This application claims priority to and the benefit of U.S. Provisional Patent Application No. 62/775,169, filed on Dec. 4, 2018 and entitled "Apparatus and Method for Temperature Control Using Centralized Chiller for Multiple Testing Systems", the contents of which are incorporated herein by reference as though fully set forth herein.

FIELD OF THE TECHNOLOGY

The subject disclosure relates to temperature control systems and more particularly to temperature control systems for multiple test sites on a testing floor.

BACKGROUND OF THE TECHNOLOGY

In engineering laboratories, and production and/or testing floors, there is often a need to generate a fluid stream of a specific regulated temperature at a number of separate test sites for testing devices, such as semiconductor wafers, chips, packaged ICs, and other electronic devices and systems. The fluid stream can be applied to the device under test at the test site to allow testers to verify performance of the device at a specific temperature, maintain a given throughput during testing, or troubleshoot problems. Typically, each test site includes its own temperature control system which produces a fluid stream of the desired temperature. However, this can result in inefficiencies when tests are being carried out at many different test stations in a test environment. Further, space is often limited in testing environments and the temperature control system often take up a significant amount of space.

One solution to some of the aforementioned problems has been to utilize a central cold air source which is then delivered to each remote test station for testing. This approach has a number of disadvantages. Thermal loss between the cold air source and test stations is difficult to minimize. Specialized piping, such as vacuum jacketed hoses, which can be very expensive is often used between the central cold air source and test stations. Further, this type of piping tends to be inflexible and have a finite lifetime before it needs replacement. These systems also tend to take a long period of time for the distributed cool air to fully cool down the piping itself, which results in a delay in the cooling process and negatively impacts the performance at the local test sites. As such, control of the cool air can be difficult and precise temperatures at each test site can be costly, if not impossible, to achieve. Therefore there is a need for a cost effective and efficient temperature control system for a testing environment.

SUMMARY OF THE TECHNOLOGY

In light of the needs described above, in at least one aspect, the subject technology relates to a temperature control system for controlling temperature at a number of test sites which eliminates the need to chill an air stream at each local test site or transfer an already cooled air stream to each local test site.

In at least one aspect, the subject technology relates to a temperature control system including a fluid chiller, an air dryer, and a plurality of test stations. The fluid chiller is configured to generate a chilled fluid stream. The air dryer is configured to generate a dry air stream. The test stations are positioned at remote locations from the fluid chiller and the air dryer, each test station having a heat exchanger and thermal control unit. The heat exchanger is configured to selectively cool the dry air stream with the chilled fluid stream to generate an output stream. The heat exchanger can have a liquid side and an air side, the liquid side connected to the fluid chiller to receive the chilled fluid stream, the air side connected to the air dryer to receive the dry air stream. The thermal control unit is configured to control distribution of the output stream to a local test site.

In some embodiments, the thermal control unit further includes a heater configured to selectively heat the cooled air stream of said thermal control unit to a desired temperature for distribution. Each thermal control unit can also include a thermal head for distribution of the cooled air stream at the local test site. Each thermal control unit can be further configured to control a flow rate of the cooled air stream through the thermal head. In some embodiments, the chilled fluid stream is transferred between the fluid chiller and heat exchangers on a closed loop such that the chilled fluid stream is returned to the fluid chiller after circulation through each heat exchanger. In some cases, each local test site can include a device under test. Each thermal control unit can distribute the cooled air stream to the device under test at the local test site of the thermal control unit.

In at least one aspect, the subject technology relates to a method of temperature control at a plurality of test stations. A chilled fluid stream is generated with a fluid chiller. A dry air stream is generated with an air dryer. The chilled fluid stream and dry air stream are provided to the plurality of test stations, the plurality of test stations being remote from the fluid chiller and the air dryer. The dry air stream is cooled with the chilled fluid using a heat exchanger to generate a cooled air stream. The cooled air stream is distributed, with a thermal control unit, at each test station to a local test site.

In some embodiments, each thermal control unit includes a heater and the thermal control unit selectively heats the cooled air stream, using the heater, to a desired temperature for distribution. In some embodiments, each thermal control unit further includes a thermal head for distribution of the cooled air stream at the local test site, the method including controlling a flow rate of the cooled air stream through the thermal head for distribution. In some cases, the chilled fluid stream is provided to the test sites on a closed loop between the fluid chiller and the heat exchangers such that the chilled fluid stream is returned to the fluid chiller after circulation through each heat exchanger. In some cases, each local test station includes a device under test. The cooled air stream can then be distributed, at each thermal control unit, to the device under test at the local test site of said thermal control unit.

BRIEF DESCRIPTION OF THE DRAWINGS

So that those having ordinary skill in the art to which the disclosed system pertains will more readily understand how to make and use the same, reference may be had to the following drawings.

DETAILED DESCRIPTION

Figure 1:
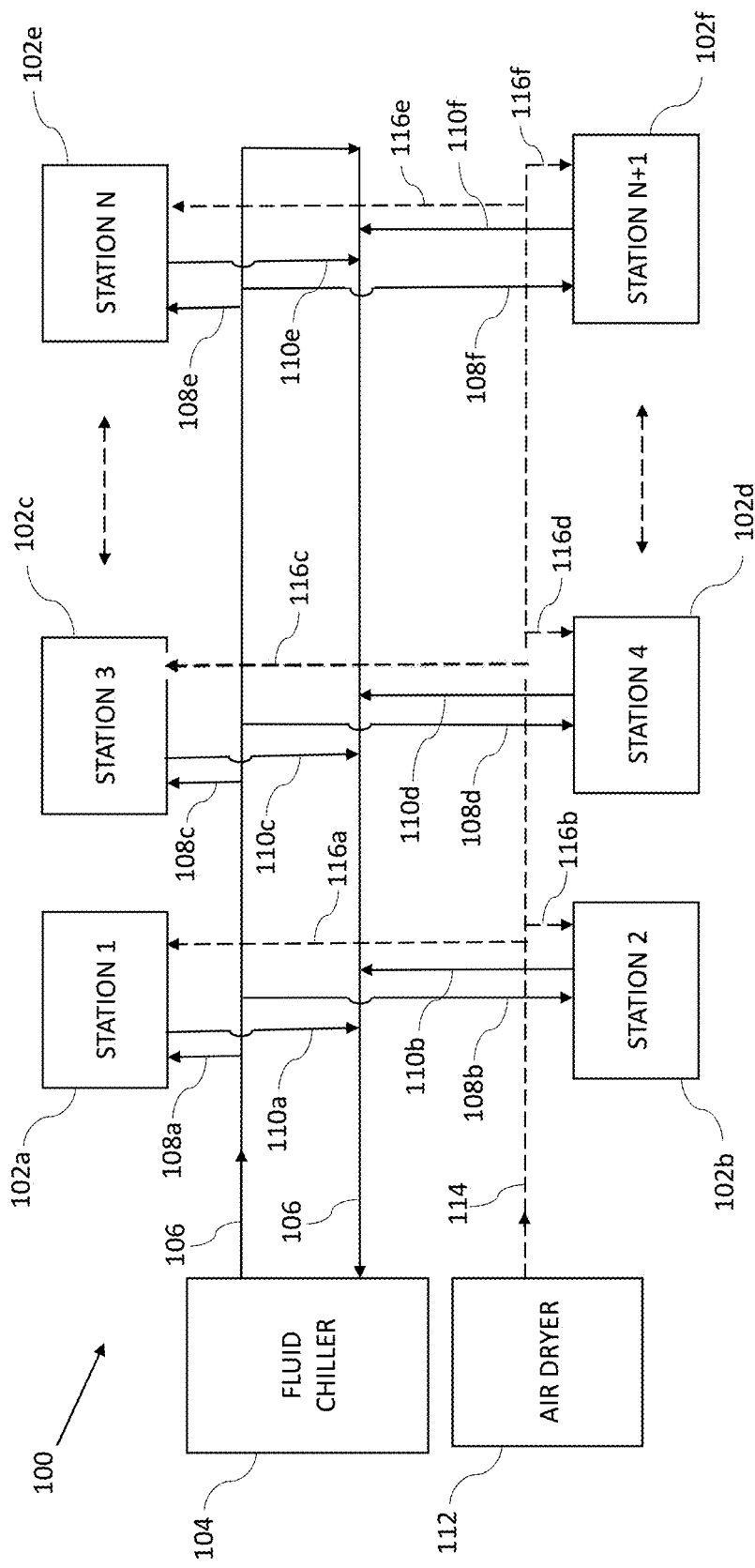
FIG. 1 is a block diagram showing a temperature control system in accordance with the subject technology.

The subject technology overcomes many of the prior art problems associated with temperature control systems. In brief summary, the subject technology provides a chilled fluid stream and dry air stream from a remote location for producing a cooled air stream at a number of individual test sites. The advantages, and other features of the systems and methods disclosed herein, will become more readily apparent to those having ordinary skill in the art from the following detailed description of certain preferred embodiments taken in conjunction with the drawings which set forth representative embodiments of the present invention. Like reference numerals are used herein to denote like parts. Further, words denoting orientation such as "upper", "lower", "distal", and "proximate" are merely used to help describe the location of components with respect to one another. For example, an "upper" surface of a part is merely meant to describe a surface that is separate from the "lower" surface of that same part. No words denoting orientation are used to describe an absolute orientation (i.e. where an "upper" part must always be at a higher elevation).

Referring now to FIG. 1, a block diagram of an exemplary temperature control system 100 in accordance with the subject technology is shown. The temperature control system 100 is located within a testing environment, such as an engineering laboratory, for testing devices at a number of different test stations 102*a*-*f* (generally 102). Note that while six test stations 102 are shown in FIG. 1, it should be understood that any number of test stations can be used in the system 100 in accordance with the subject technology. The system 100 includes a single fluid chiller 104 and air dryer 106 which are located remotely from the test stations 102. The temperature control system 100 allows for regulation of an air temperature provided to devices under test at each test station 102. In exemplary cases, the device under test can be a semiconductor wafer, a chip, a packaged ICs, and/or another electronic device or system.

The fluid chiller 104 is configured to generate a chilled fluid stream. The fluid chiller 104 can be any type of fluid chiller as are known in the art, such as a single stage or cascade mechanical compressor. Alternatively, a liquid nitrogen refrigerated chiller may be the source for cooling the fluid, or other known chilling techniques can be used. The fluid for the chilled fluid stream can be one or more refrigerant fluid, as are known in the art, depending on the desired fluid chiller output temperature for a given test environment. For example, HFE7100, HFE7000, Dynalene MV (sold by Dynalene, Inc. of 5250 West Coplay Road, Whitehall, Pa. 18052), and Syltherm XLT (sold by The Dow Chemical Company of 2211 H.H. Dow Way, Midland, Mich. 48674), have all been found to be effective refrigerant fluids for use in the fluid chiller 104. The fluid chiller 104 can generate a chilled fluid stream of −60 degrees Celsius, and if necessary, can be configured to generate a chilled fluid stream as low as −100 degrees Celsius.

The chilled fluid stream is sent from the fluid chiller 104 to the remote test stations 102 through a main piping line 106. Additional piping for each test station 102 forms feed lines 108*a*-108*f* (generally 108) for transferring chilled fluid from the main line 106 to each test station 102. As will be discussed in more detail below, the chilled fluid stream can then be used to cool an air stream locally at each test station 102. The chilled fluid stream is then returned, through a return line 110*a*-110*f* (generally 110), to the main line 106 where it is returned to the fluid chiller 104. In this way, the main line 106 forms a closed loop with the fluid chiller 104, allowing the fluid chiller 104 to reuse the refrigerant fluid. Further, returning fluid tends to retain some amount of cooling even after being used to cool the air stream at a test site 102, and therefore this cooled fluid can be reused efficiently.

The air dryer 112 is configured to generate a dry air stream. Like the fluid chiller 104, the air dryer 112 is located remotely from the test stations 102. The air dryer 112 can pull air from the surrounding environment at the remote location and dry it. Air from the dry air stream is ultimately used to regulate the temperature of the device under test at each test station 102. Therefore the air dryer 112 ensures that the air used for testing does not have unwanted moisture which could potentially have adverse effects on the device under test. The dry air stream from the air dryer 112 is transported through a main piping line 114 for the air, with individual piping lines 116*a*-116*f* (generally 116) providing dry air from the main line 114 to each remote test station 102. Unlike the fluid chiller 104 which operates on a closed loop, the air is expelled at each test station 102 and therefore no return piping for a closed loop is necessary.

Figure 2:
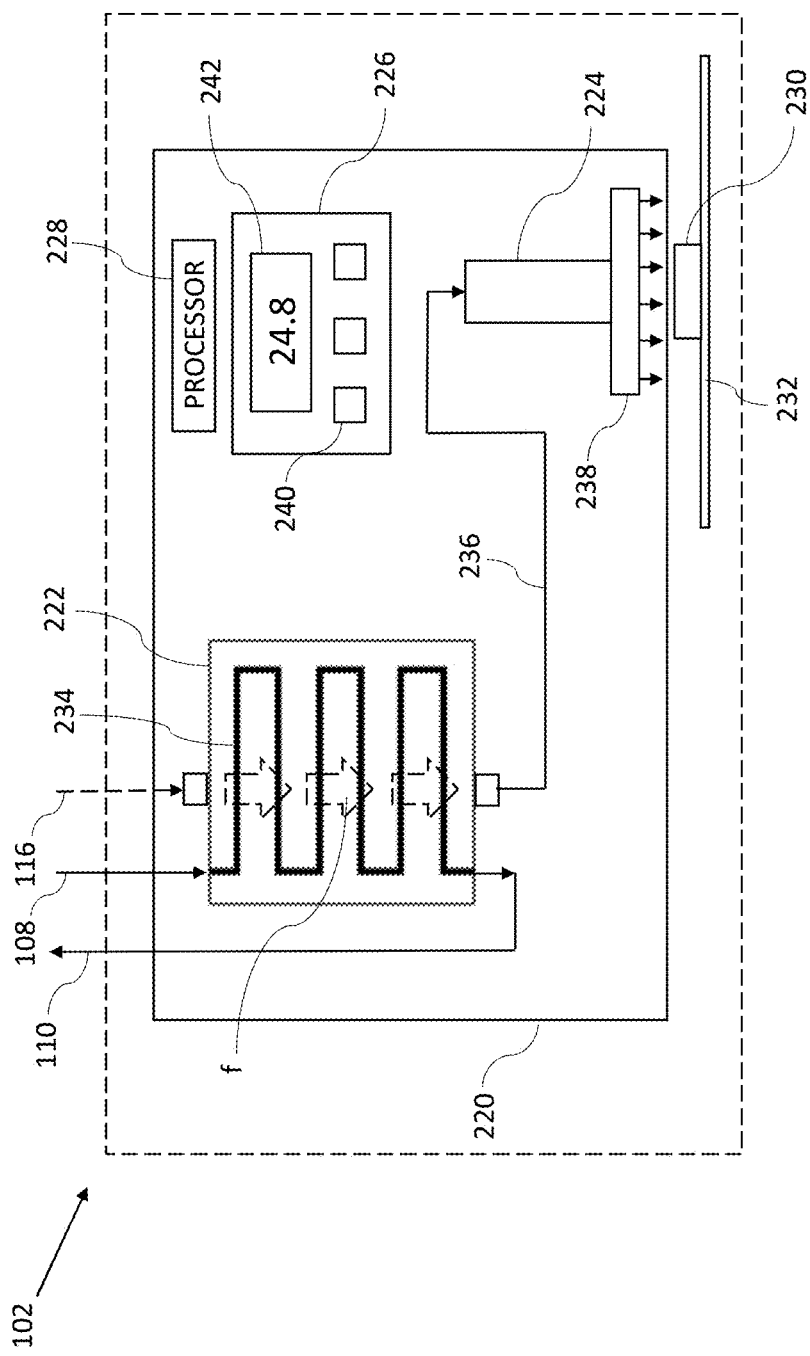
FIG. 2 is a schematic diagram of a local test site as part of the system of FIG. 1.

Referring now to FIG. 2, a schematic diagram of an exemplary test station 102 as part of a system 100 in accordance with the subject technology is shown. It should be understood that any of the test stations 102*a*-102*f*, or other test stations in accordance with the subject technology, can include components and function similarly to those of the test station 102 of FIG. 2. The test station 102 includes a thermal control unit 220 which includes a heat exchanger 222, a thermal head 224, an input/output device 226, and a processor 228. Notably, while these components are shown as exemplary components for the thermal control unit 220 and can be packaged together, such as in a shared housing, it should be understood that they need not be included as part of the thermal control unit 220 in all cases. For example, the heat exchanger 222 could be packaged separately and input/output devices 226 (or their functions) could be replaced by an external device. A device under test 230 is affixed to a support structure 232 of a test site for testing.

The heat exchanger 222 generally cools the dry air stream using the chilled fluid stream as a coolant. The heat exchanger 222 could be any type of heat exchanger suited to these purposes for the desired testing conditions (e.g. temperature, air flow, etc.) as are known in the art. A feed line 108 provides the chilled fluid stream from the fluid chiller 104 to a liquid side of the heat exchanger 222. The chilled fluid stream is transported through a fluid side medium 234, such as piping, plates, or other fluid exchanger fluid side medium, which snakes through the heat exchanger 222. After passing through the fluid side medium 234, the chilled fluid stream exits the heat exchanger 222 and is returned, through return line 110, to the main piping line 106 where it is then returned to the fluid chiller 104.

The dry air stream from the air dryer 112 is provided to an intake for an air side of the heat exchanger 222. The air then flows (e.g. flow arrows "f") through the air side of the heat exchanger 222, passing around the chilled fluid on the liquid side so that heat is transferred between the dry air stream and the chilled fluid stream. In this way, the dry air stream is cooled and the heat exchanger 222 outputs a cooled dry air stream which can be provided to the thermal head 224 via a flexible connecting hose 236 or other medium. The thermal control unit 220 then distributes the cooled air stream air at a test site for the device under test 230 via the thermal head 224. In the example shown, the thermal head 224 includes a T-cap 238 and which can be placed adjacent to the device under test 230 to deliver the cooled air stream to the device 230, thereby regulating the temperature the device 230 during testing. The thermal control unit 220 is also configured to provide various flow and temperature control capabilities, which are described in more detail below. These capabilities can be implemented manually or automatically. The processor 228, which can be a general purpose computer connected to memory, application specific circuit, or other device configured to carry out one or more functions as discussed herein. Thus, the processor 228 can be configured to implement flow and temperature control functions automatically based on certain measured conditions or input. The input/output device 226 can include one or more buttons 240, or other standard input types, for inputting information such as a desired air flow, device under test temperature, or output air temperature set point which the processor 228 can cause the temperature control unit 220 to act on. A display screen 242 on the input/output device 226 can provide output to the user on current air flow and temperature conditions and/or settings.

Figure 3:
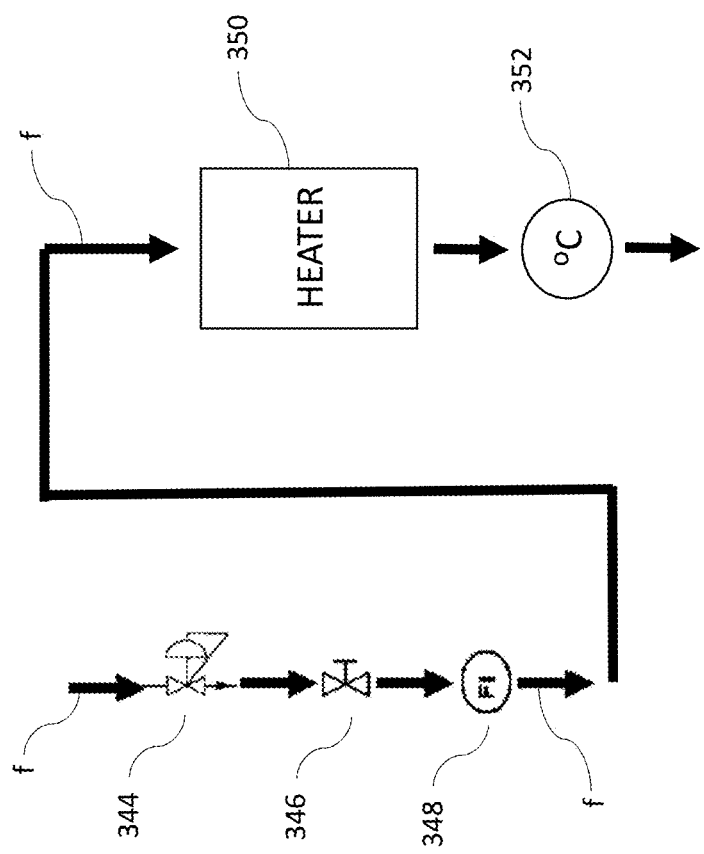
FIG. 3 is a schematic diagram of flow control through the temperature control unit as part of the system of FIG. 1.

Referring now to FIG. 3, various flow and temperature control devices for a thermal control unit 220 in accordance with the subject technology are shown. Air flow through the temperature control unit 220 is denoted by the arrows "f". The thermal control unit 220 can regulate air flow, either before the heat exchanger 222 or after the heat exchanger 222 (e.g. cooled air at the thermal head 224), using valves. Valves can include a pressure regulator 344 for controlling air pressure and a manually or automatically adjustable flow control value 346 for controlling the air flow rate through the thermal control unit 220. The thermal control unit 220 can also include a mass flow sensor 348 for monitoring the air in the thermal control unit 220. The mass flow sensor 348 can communicate with the processor 228 and/or input/output device 226 where the sensed data can be relied upon for automatic or manual adjustments, or displayed for a user. After passing through the heat exchanger 222, the thermal control unit 220 can also include a heater 350 for heating the air, which can be located within the thermal head 224. Since the system 100 includes numerous test stations 102, which each may have their own temperature requirements and work off a shared fluid chiller 104, it may be necessary to heat the final air stream before it is provided to the device under test 230 to obtain a desired temperature. Further, it can be easier to cool the initial dry air stream in the heat exchanger 222 more than necessary for testing, and then heat it up slightly to the desired test temperature using a heater 350, rather than attempting to precisely control the output temperature at the heat exchanger 222 for testing. A temperature sensor 352 can be included, before and/or after the heater 350 in the thermal control unit 220 for determining the air temperature prior to or after the heater 350, respectively. Similarly, in some cases, the thermal control unit can 220 can also include another local chiller (not show distinctly), allowing for further fine adjustments to the temperature after the air has exited the heat exchanger 222.

Figure 4:
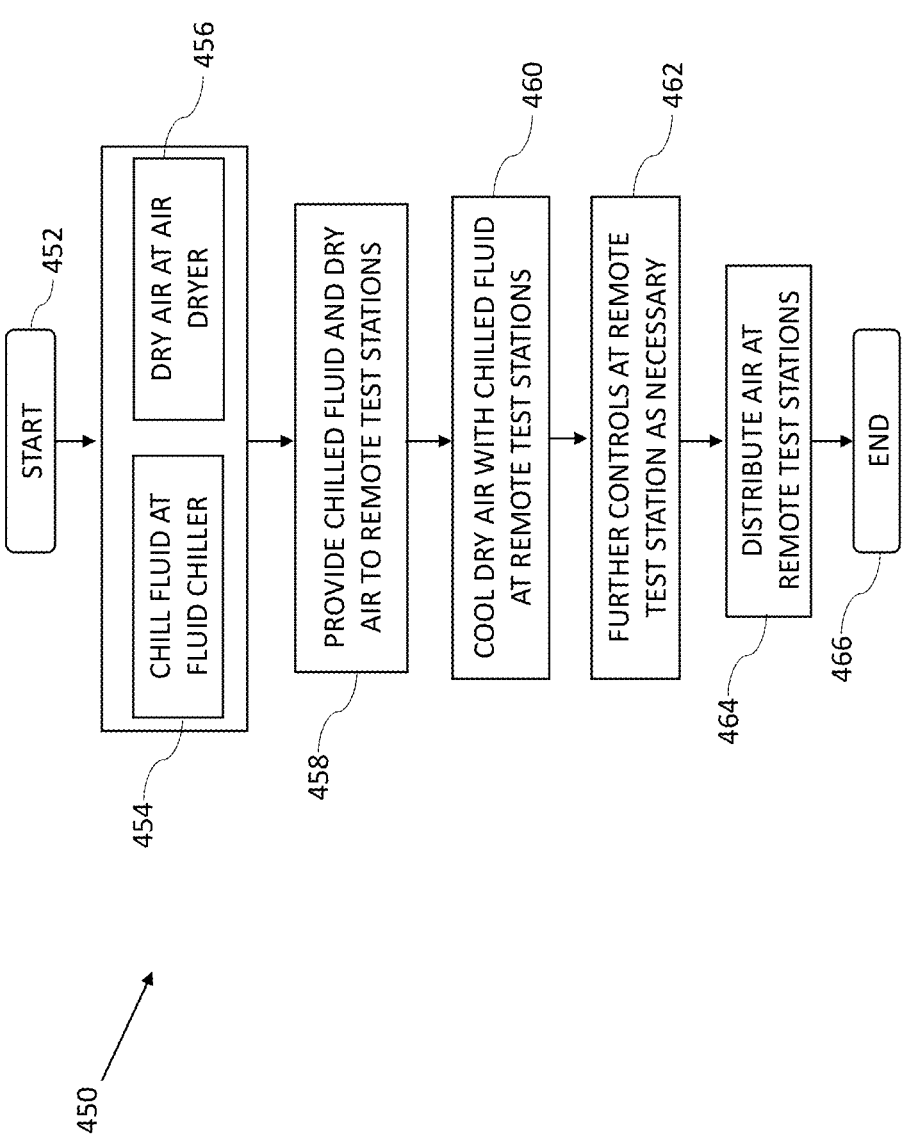
FIG. 4 is a method of controlling temperature at a plurality of test sites in accordance with the subject technology.

Referring now to FIG. 4, a method 450 of controlling temperature a testing area with a plurality of test stations is shown. It should be understood that the method 450 can be carried out using the physical components described elsewhere herein, or components similarly suited for the tasks described herein, as would be understood by one of skill in the art.

The method starts, at step 452. At step 454, a chilled fluid stream is generated with a fluid chiller. At step 456, a dry air stream is generated with an air dryer. Notably, the method 450 is generally carried out by performing steps 454 and 456 simultaneously, such that the chilled fluid stream can be used to cool the dry air stream. However, in some cases, a higher temperature air stream may be desired at one or more of the test sites, in which case the chilled fluid stream need not be provided to those test sites. Otherwise, and in most cases, the chilled fluid and dry air stream are both provided to the test stations at step 458, the test stations being remote from fluid chiller and air dryer.

At step 460, at each test station, a heat exchanger receives the dry air stream and the chilled fluid stream. The streams pass through the heat exchanger and the dry air stream is cooled with the chilled fluid stream, the air stream being output from the heat exchanger as a cooled air stream. Other control of the air stream can also be carried out at step 462. For example, air flow of the air stream (either the dry air or the cooled air stream) can be controlled to a set pressure and/or flow rate using valves. While step 462 is shown for illustrative purposes as occurring after step 460, it should be understood that controlling the pressure and/or flow of air can also occur prior to the dry air stream entering the heat exchanger. Further, additional control, such as heating the air up with a heater to reach a desired temperature can occur at step 462, heating occurring after the air has passed through the heat exchanger. The air is then distributed at step 464, from each thermal control unit, to a local test site, the local test sites each being at one of the test stations and therefore being remote from the fluid chiller and air dryer. During distribution by the thermal control unit, the air stream can be applied to a device under test at the local test site to control a temperature of the device under test, or around the device under test. The method 450 then ends at step 466, and can be repeated as desired.

The aforementioned systems and methods have a number of advantages. Space in engineering laboratories, production facilities, and testing environments is at a premium. This is particularly true when testing electronic devices, such as semiconductor wafers, chips, packaged ICs, and other electronic devices and systems, which are often required to meet certain performance criteria at a given temperature. The subject disclosure allows for a single primary chiller and air dryer to be used for multiple test sites simultaneously, conserving space at each test site and improving efficiency. Each test site then only needs to be equipped with tools to cool the air stream, and make other slight adjustments to temperature and/or flow control at each test station. This allows for more test sites in a given space, while simultaneously providing for easy regulation for testing and/or throughput during production within these environments. Further, it moves noisy unwanted equipment, including the fluid chiller and air dryer, away from the test station where it could negatively impact the testing processes and/or environment, including by outputting unwanted heat proximate to an area where a device is being tested under cool conditions. No expensive piping for remotely chilled air is required since the air stream is not chilled until it exits the heat exchanger at a local test site. This is because the high heat capacitance of the transported chilled liquid tends to gain significantly less energy during transport and therefore be more efficient. Further, if there are problems with a given heat exchanger, they can be done one station at a time, without impacting testing at the other stations. Particular controls can also be implemented at any given test site for the purposes of the specific tests being conducted thereon, including sensors, actuators, and so for, to control air flow, temperature, and distribution at the test site.

It should be noted that the subject technology has been found to effectively operate between a wide range of temperatures, outputting air at temperatures as low as −100 degrees Celsius and as high as 300 degrees Celsius (by not cooling the drier air and using heaters at each test site). Typical air distribution rates at each test site are 4-18 SCFM, although other flow rates can be used. A temperature of substantially 20 degrees Celsius air has been found to be effective for the air dryer stream provided to each heat exchangers, although other temperature air, including room temperature, could also be used, and dry air temperature can vary depending on a given application.

All orientations and arrangements of the components shown herein are used by way of example only. Further, it will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may depend from any or all claims in a multiple dependent manner even though such has not been originally claimed.

What is claimed is:

1. A temperature control system comprising:
  a fluid chiller configured to generate a chilled liquid stream and provide the chilled liquid stream to a fluid chiller main line forming a closed loop with the fluid chiller;
  an air dryer configured to generate a dry air stream and provide the dry air stream to an air dryer main line; and
  a plurality of test stations positioned at remote locations from the fluid chiller and the air dryer, each test station comprising:
    a heat exchanger configured to selectively cool the dry air stream with the chilled liquid stream to generate an output stream; and
    a thermal control unit configured to control distribution of the output stream to a local test site.

2. The temperature control system of claim 1, wherein each test station further comprises:
  a test station feed line for transferring the chilled liquid stream from the fluid chiller main line to the heat exchanger;
  a test station return line for transferring the chilled liquid stream from the heat exchanger to the fluid chiller main line; and
  a test station air line for receiving the dry air stream from the air dryer main line.

3. A temperature control system comprising:
  a fluid chiller configured to generate a chilled liquid stream and provide the chilled liquid stream to a fluid chiller main line forming a closed loop with the fluid chiller;
  an air dryer configured to generate a dry air stream and provide the dry air stream to an air dryer main line; and
  a plurality of test stations positioned at remote locations from the fluid chiller and the air dryer, each test station comprising:
    a heat exchanger having a liquid side and an air side, the liquid side connected to the fluid chiller to receive the chilled liquid stream, the air side connected to the air dryer to receive the dry air stream, the heat exchanger configured to cool the dry air stream with the chilled liquid stream and generate a cooled air stream; and
    a thermal control unit configured to control distribution of the cooled air stream to a local test site.

4. The temperature control system of claim 3, wherein each thermal control unit further includes a heater configured to selectively heat the cooled air stream of said thermal control unit to a desired temperature for distribution.

5. The temperature control system of claim 3, wherein:
  each thermal control unit includes a thermal head for distribution of the cooled air stream at the local test site; and
  each thermal control unit is further configured to control a flow rate of the cooled air stream through the thermal head.

6. The temperature control system of claim 3, wherein the chilled liquid stream is transferred between the fluid chiller and heat exchangers on a closed loop such that the chilled fluid stream is returned to the fluid chiller after circulation through each heat exchanger.

7. The temperature control system of claim 3, wherein:
  each local test site includes a device under test; and
  each thermal control unit distributes the cooled air stream to the device under test at the local test site of the thermal control unit.

8. A method of temperature control at a plurality of test stations comprising:
  generating, with a fluid chiller, a chilled liquid stream and providing the chilled liquid stream to a fluid chiller main line forming a closed loop with the fluid chiller;
  generating, with an air dryer, a dry air stream and providing the dry air stream to an air dryer main line;
  providing the chilled liquid stream and dry air stream to the plurality of test stations, the plurality of test stations being remote from the fluid chiller and the air dryer;
  with a heat exchanger at each test station, cool the dry air stream with the chilled fluid to generate a cooled air stream; and
  with a thermal control unit at each test station, distribute the cooled air stream at said test station to a local test site.

9. The method of claim 8, wherein each thermal control unit includes a heater and further comprising:
  at each thermal control unit, selectively heating the cooled air stream to a desired temperature, with the heater, for distribution.

10. The method of claim 8, wherein each thermal control unit further includes a thermal head for distribution of the cooled air stream at the local test site, further comprising:
  controlling a flow rate of the cooled air stream through the thermal head for distribution.

11. The method of claim 8, wherein the chilled liquid stream is provided to the test sites on a closed loop between the fluid chiller and the heat exchangers such that the chilled liquid stream is returned to the fluid chiller after circulation through each heat exchanger.

12. The method of claim 8, wherein:
  each local test station includes a device under test, and the cooled air stream is distributed, at each thermal control unit, to the device under test at the local test site of said thermal control unit.

* * * * *